US011153998B2

(12) United States Patent
Imanishi et al.

(10) Patent No.: US 11,153,998 B2
(45) Date of Patent: Oct. 19, 2021

(54) TAPE CURVING ATTACHMENT AND FEEDER

(71) Applicant: FUJI CORPORATION, Chiryu (JP)

(72) Inventors: Satoshi Imanishi, Okazaki (JP); Yukinori Takada, Anjo (JP)

(73) Assignee: FUJI CORPORATION, Chiryu (JP)

(*) Notice: Subject to any disclaimer, the term of this patent is extended or adjusted under 35 U.S.C. 154(b) by 643 days.

(21) Appl. No.: 15/775,863

(22) PCT Filed: Nov. 25, 2015

(86) PCT No.: PCT/JP2015/083037
§ 371 (c)(1),
(2) Date: May 14, 2018

(87) PCT Pub. No.: WO2017/090112
PCT Pub. Date: Jun. 1, 2017

(65) Prior Publication Data
US 2018/0332743 A1 Nov. 15, 2018

(51) Int. Cl.
H05K 13/02 (2006.01)
H05K 13/04 (2006.01)
B21B 39/14 (2006.01)

(52) U.S. Cl.
CPC ......... H05K 13/022 (2013.01); B21B 39/14 (2013.01); H05K 13/0409 (2018.08); H05K 13/0419 (2018.08)

(58) Field of Classification Search
CPC ............ H05K 13/022; H05K 13/0409; H05K 13/0419; B21B 39/14
See application file for complete search history.

(56) References Cited

U.S. PATENT DOCUMENTS 6,032,783 A * 3/2000 Saito .................. H05K 13/0434
198/390
7,464,741 B2 * 12/2008 Kawaguchi ........ H05K 13/0419
156/750
8,276,267 B2 * 10/2012 Choi .................. H05K 13/0419
29/832

(Continued)

FOREIGN PATENT DOCUMENTS

JP 2010-157647 A 7/2010
JP 2014-53601 A 4/2011

(Continued)

OTHER PUBLICATIONS

International Search Report dated Mar. 1, 2016 in PCT/JP2015/083037 filed Nov. 25, 2015.

Primary Examiner — Minh N Trinh
(74) Attorney, Agent, or Firm — Oblon, McClelland, Maier & Neustadt, L.L.P.

(57) ABSTRACT

A tape curving attachments is provided with tape curving sections configured to curve component storage tape wound around a reel, the component storage tape being carrier tape with cavities in which components are stored and top tape attached to an upper surface of the carrier tape, such that the top tape side of the component storage tape has a smaller radius of curvature than the carrier tape side of the component storage tape, the tape curving attachment being attached to a feeder that pitch feeds the component storage tape from the reel.

6 Claims, 4 Drawing Sheets

(56) References Cited

U.S. PATENT DOCUMENTS

| | | | | |
|---|---|---|---|---|
| 2008/0000077 A1* | 1/2008 | Van Gastel | ........ | H05K 13/0419 29/729 |
| 2014/0060749 A1 | 3/2014 | Choi | | |
| 2015/0060478 A1* | 3/2015 | Noda | ................. | H05K 13/0417 221/73 |
| 2015/0195964 A1* | 7/2015 | Yamasaki | .......... | H05K 13/0419 226/76 |

FOREIGN PATENT DOCUMENTS

| | | |
|---|---|---|
| JP | 2014-78607 A | 5/2014 |
| JP | 2011-71257 A | 11/2015 |

\* cited by examiner

TAPE CURVING ATTACHMENT AND FEEDER

TECHNICAL FIELD

The present application relates to a tape curving attachment and feeder.

BACKGROUND ART

In conventional component mounters, components stored in component storage tape supplied by a feeder are picked up by a suction nozzle and mounted on a board. Component storage tape is provided with carrier tape in which cavities that store component are formed at fixed intervals, and top tape attached to an upper surface of the carrier tape that covers the cavities in which the components are stored.

The feeder holds a reel, on which is wound the component storage tape, on a reel holding section provided at the rear end of the feeder main body, and drives a sprocket of a pitch feeding mechanism provided on the feeder main body that engages with feeding holes formed in the component storage tape. Also, the feeder feeds the component storage tape from the reel at a regular pitch, peels the top tape from the carrier tape while the component storage tape is transported along a tape conveyance path provided in the feeder main body, and consecutively supplies the components in the cavities to a component supply position provided at the front end of the feeder main body (refer to patent literature 1).

CITATION LIST

Patent Literature

Patent literature 1: JP2011-71257

BRIEF SUMMARY

Technical Problem

Generally, because components stored in component storage tape are stored with some clearance from the inside of the cavities, when the component storage tape is fed from the reel, the components may adhere to the top tape due to the adhesiveness of the top tape. This adhering occurs more easily towards the end of the reel, which is curved such that the top tape has a very small radius of curvature.

In this case, when the top tape is peeled from the carrier tape, if the component is flipped inside the cavity, the orientation of the component during pickup by the suction nozzle may become bad, leading to an error during image processing of the component. Also, when the top tape is peeled from the carrier tape, there is a worry that the component will fall from the cavity, leading to a pickup error by the suction nozzle.

The present disclosure takes account of such problems, and an object thereof is to provide a tape curving attachment that curtails the adhering of components to top tape, and a feeder provided with the attachment.

Solution to Problem

To solve the above problems, a tape curving attachment of the present disclosure includes: a tape curving section configured to curve component storage tape wound around a reel, the component storage tape being carrier tape with cavities in which components are stored and top tape attached to an upper surface of the carrier tape, such that the top tape side of the component storage tape has a smaller radius of curvature than the carrier tape side of the component storage tape, the tape curving attachment being configured to be attached to a feeder that pitch feeds the component storage tape from the reel. With the tape curving section, because a location at which a component and the top tape adhere is stretched, the adhering of the component to the top tape is curtailed, and the component is made to fall to the bottom of the cavity.

Also, to solve the above problems, a feeder of the present disclosure is configured to have the above tape curving attachment attached, and to pitch feed the component storage tape wound on the reel from the reel. Because a component adhering to the top tape drops to the bottom of the cavity at the tape curving section, when the top tape is peeled from the carrier tape, the component is not flipped inside the cavity. Thus, the orientation of the component during pickup by a suction nozzle of a component mounter on which the feeder is set can be maintained in a good state, and image processing of the component can be performed with good accuracy. Also, when the top tape is peeled from the carrier tape, because the component is prevented from jumping from the cavity, it is possible to reliably perform component pickup with the suction nozzle.

DESCRIPTION OF EMBODIMENTS

1. Feeder Configuration

Figure 1:
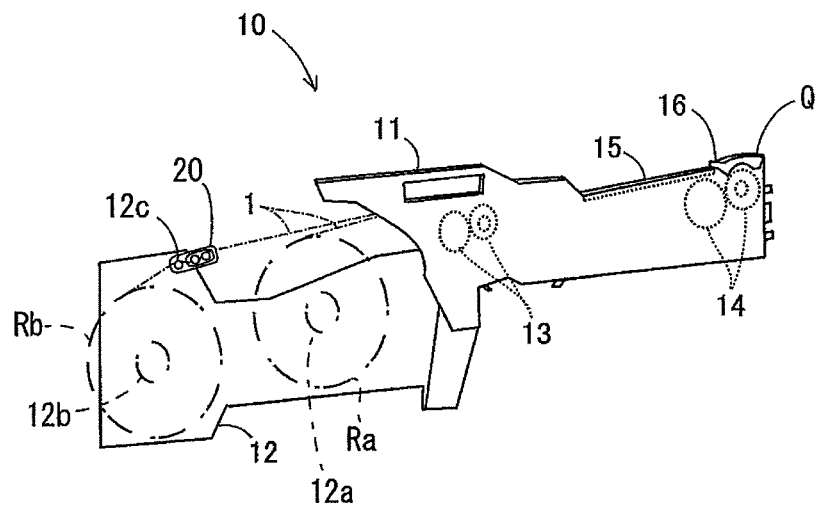
FIG. 1 shows a feeder provided with a tape curving attachment of an embodiment.
Figure 3:
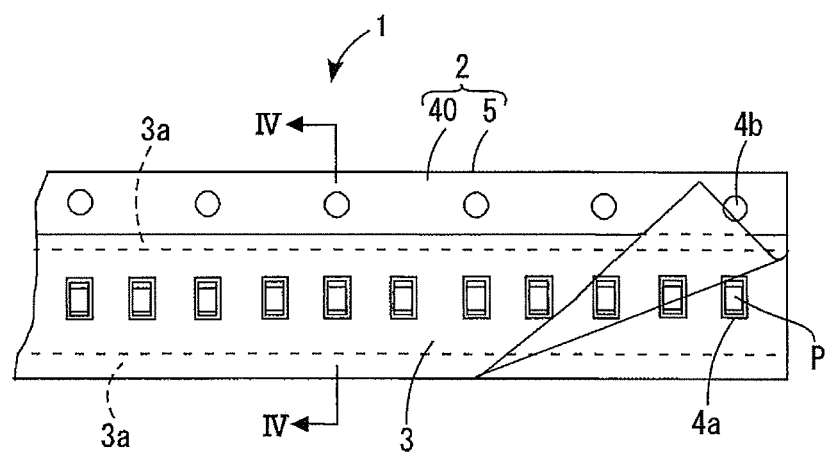
FIG. 3 is a plan view of component storage tape conveyed by the feeder.
Figure 4:
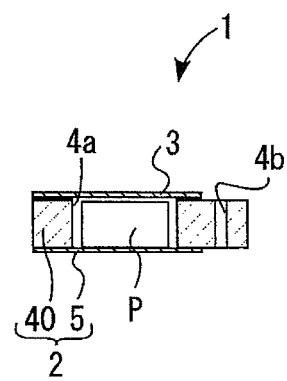
FIG. 4 is a cross section of the component storage tape of FIG. 3 along IV-IV.

An embodiment of the disclosure, a feeder provided with a tape curving attachment, will be described with reference to the figures. As shown in FIG. 1, feeder 10 is loaded on a component mounter, which is not shown, and is a device for supplying components by pitch feeding component supply tape 1 in which multiple components are stored in a single row. Details are described later, but as shown in FIGS. 3 and 4, component storage tape 1 is configured from carrier tape 2 with cavities 4a in which components P are stored, and top tape 3 attached to an upper surface of carrier tape 2. Component storage tape 1 is conveyed in feeder 10 from the rear side (the left side in FIG. 1) to the front side (the right side in FIG. 1).

As shown in FIG. 1, reel holding section 12 is provided at the rear end of feeder main body 11 of feeder 10. Two reels, Ra and Rb, on each of which is wound component storage tape 1, are removably held on reel holding section 12 lined up in the front-rear direction. Reel Ra and Rb are rotatably attached to reel holding members 12a and 12b respectively such that the component storage tape 1 on each reel can be pulled towards the front side of feeder main body 11 from the upper side of reels Ra and Rb.

First roller 12c for supporting component storage tape 1 pulled from rear side reel Rb is provided above and between holding members 12a and 12b at reel holding section 12. First roller 12c, by raising component storage tape 1 that is pulled from rear side reel Rb, prevents interference between that component storage tape 1 and front side reel Ra. Further, tape curving attachment is attached to and supported by first roller 12c.

Here, as described in the background art, because components P stored in component storage tape 1 are stored with some clearance from the inside of cavities 4a, when component storage tape 1 is fed from the reel Rb, the components P may adhere to top tape 3 due to the adhesiveness of top tape 3. Tape curving attachment 20 is provided to reduce this adhering of components P to top tape 3.

Figure 2A:
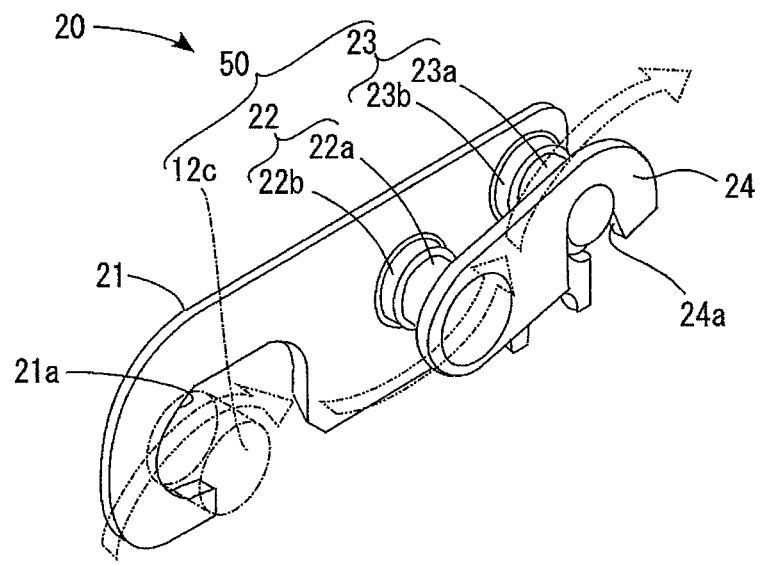
FIG. 2A is a perspective view showing the tape curving attachment.

As shown in FIG. 2A, tape curving attachment 20 is provided with tape curving section 50, frame 21, and cover 24. Tape curving section 50 is provided with three curving sections (referred to as first, second, and third curving sections). With tape curving attachment 20, the first curving section is configured from first roller 12c, the second curving section is configured from second roller 22, and the third curving section is configured from third roller 23. Frame 21 is an approximately rectangular plate, and C-shaped catch 21a for catching on first roller 12c is provided on the rear end (left end in FIG. 2A) of frame 21. Also, second and third rollers 22 and 23 are respectively provided at the front end (right end in FIG. 2A) of frame 21 on a side surface in a rotatable manner, second and third rollers 22 and 23 respectively having shafts 22a and 23a that are perpendicular with respect to the side surface.

With second and third rollers 22 and 23, an end of each of shafts 22a and 23a is fixed to frame 21, and pairs of bearings with a flange, 22b and 22b, and 23b and 23b, are respectively engaged on both ends of a protruding portion of shafts 22a and 23a (in FIG. 2A, bearings 22b and 23b on the cover 24 side are not shown). As shown by the two-dotted broken line arrows in FIG. 2A, component storage tape 1 that is pulled from rear side reel Rb is fed on first roller 12c, second roller 22, and third roller 23. Component storage tape 1 is conveyed in the direction of the arrows. Because the pairs of bearings with a flange 22b and 22b, and 23b and 23b, are each arranged at an interval slightly wider than the width of component storage tape 1, it is possible to smoothly convey component storage tape 1 while reliably guiding component storage tape 1.

Component storage tape 1 pulled from rear side reel Rb, as being fed towards feeder main body 11, is curved while passing over first roller 12c, is curved while passing under second roller 22, and is curved again while passing over third roller 23. In other words, first roller 12c, second roller 22, and third roller 23 curve component storage tape 1 being pulled from rear side reel Rb up and down as component storage tape is conveyed, so as to reduce the adhering of components P to top tape 3. Note that, details of how adhering of components P is reduced are described later.

Cover 24 is an approximately rectangular plate, and the rear end (right end in FIG. 2A) of cover 24 is rotatably supported on the other end of shaft 22a of second roller 22. Also, cutout 24a capable of engaging with the other end of shaft 23a of third roller 23 is provided on the front end (right end in FIG. 2A) of cover 24. As shown in FIG. 2A, cutout 24a of cover 24, in a state engaged with the other end of shaft 23a of third roller 23, stops component storage tape 1 that is hanging between second and third rollers 22 and 23 from coming off while being conveyed.

Figure 2B:
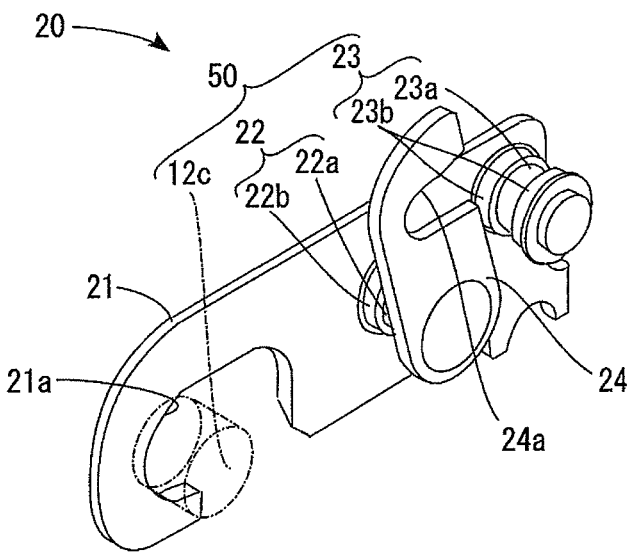
FIG. 2B is a perspective view of the tape curving attachment of FIG. 2A with the cover open.

Also, as shown in FIG. 2B, when cutout 24a of cover 24 is in a state separated from the other end of shaft 23a of third roller 23, the space between second and third rollers 22 and 23 is open, therefore, it is easy for component storage tape 1 to cross from the rear side of tape curving attachment 20 between second and third rollers 22 and 23, and it is easy for component storage tape 1 to be removed to the rear side of tape curving attachment 20 from between second and third rollers 22 and 23.

Returning to FIG. 1, tape conveyance section 13 is provided in a lower center portion of feeder main body 11. Tape conveyance section 13 pulls component storage tape 1 from reels Ra and Rb to the front side of feeder main body 11. Pitch feeding mechanism 14 is provided on an upper section at the front end of feeder main body 11, and component supply position Q is provided on the top of feeder main body 11 at the front end. Pitch feeding mechanism 14 pitch feeds component storage tape 1 being conveyed by tape conveyance section 13.

Tape feeding guide 15 is provided between pitch feeding mechanism 14 and tape conveyance section 13 at an upper surface section of feeder main body 11. Tape feeding guide 15 forms a feeding path to guide component storage tape 1 conveyed by tape conveyance section 13 and component storage tape 1 pitch fed by pitch feeding mechanism 14. Top tape peeling section 16 for peeling top tape 3 of component storage tape 1 from carrier tape 2 is provided on the front end of tape feeding guide 15.

As shown in FIGS. 3 and 4, component storage tape 1 conveyed by feeder 10 is configured from carrier tape 2 and top tape 3. Carrier tape 2 is configured from base tape 40 and bottom tape 5. Base tape 901 is formed of a flexible material such as a paper material or a resin. Cavities 4a are formed as through-holes in a center portion of base tape 40 in the width direction at a fixed interval in the length direction. Components P are stored in cavities 4a. Engagement holes 4b are formed as through-holes in a side portion of base tape 40 at a fixed interval in the length direction.

As shown in FIG. 3, both side portions of top tape 3 are adhered to both side portions of the top surface of base tape 40 using adhesive 3a, and usually top tape 3 covers the upper section of cavities 4a. Components P stored in cavities 4a are prevented from coming out by top tape 3. Top tape 3 is formed from a transparent polymer film. As shown in FIG. 4, bottom tape 5 is adhered to the bottom surface of base tape 40. Components P stored in cavities 4a are prevented from falling by bottom tape 5. Bottom tape 5 is formed of a transparent or semi-transparent paper or polymer film or the like.

The above feeder 10 is a so-called auto-loading type device. In other words, for example, when component storage tape 1 of front side reel Ra is pitch fed by pitch feeding mechanism 14 as top tape 3 is peeled by top tape peeling section 16, such that component P is supplied to component supply position Q, the leading end of component storage tape 1 of rear side reel Rb stands by in tape conveyance section 13.

Then, immediately before the pitch feeding of the trailing end of component storage tape 1 of rear side reel Ra is completed, component storage tape 1 of rear side reel Rb is conveyed in tape conveyance section 13 to pitch feeding mechanism 14, and component storage tape 1 of rear side reel Rb that is to be used next is pitch fed by pitch feeding mechanism 14 as top tape 3 is peeled by top tape peeling section 16, such that component P is supplied to component supply position Q.

Function of Tape Curving Attachment

Figure 5:
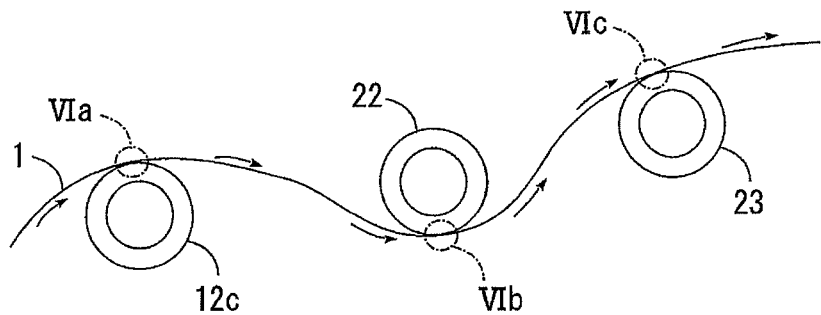
FIG. 5 shows a state in which component storage tape is curved by the tape curving attachment.

Next, functions of the above tape curving attachment 20 are described with reference to the figures. As above, tape curving attachment 20 is provided to reduce the adhering of components P to top tape 3. As shown in FIG. 5, component storage tape 1 is conveyed passing over first roller 12c, under second roller 22, and over third roller 23.

Figure 6A:
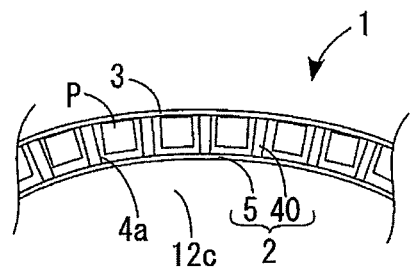
FIG. 6A is an enlarged view of section VIa of FIG. 5.

When component storage tape 1 passes over first roller 12c (portion VIa of FIG. 5), as shown in FIG. 6A, carrier tape 2 is curved up to form a convex shape. By this, because the cavity 4a side of top tape 3 is stretched, the adhering of components P to top tape 3 is curtailed.

Figure 6B:
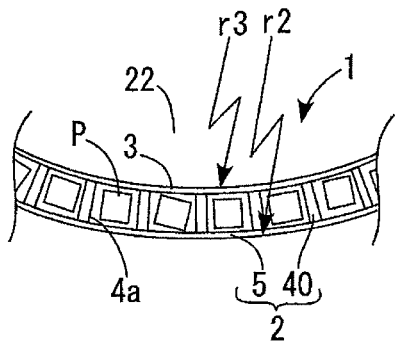
FIG. 6B is an enlarged view of section VIb of FIG. 5.

Continuing, when component storage tape 1 passes under second roller 22 (portion VIb of FIG. 5), as shown in FIG. 6B, component storage tape 1 is curved such that the radius of curvature r3 of the top tape 3 side is smaller than the radius of curvature of the carrier tape 2 side. By this, because the locations at which components P adhere to top tape 3 are stretched, the adhering of components P to top tape 3 is curtailed, and component P falls to the bottom of cavity 4a. Also, even for components P which did not fall, the adhering to top tape 3 is made weaker.

Figure 6C:
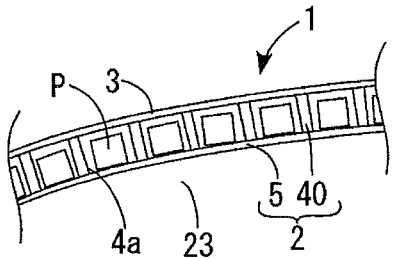
FIG. 6C is an enlarged view of section VIc of FIG. 5.

Then, when component storage tape 1 passes over third roller 23 (portion VIc of FIG. 5), as shown in FIG. 6C, carrier tape 2 is curved up again to form a convex shape. By this, because the inside of top tape 3 is squeezed, components P that did not fall earlier now fall to the bottom of 4a.

According to feeder 10 provided with this tape curving attachment 20, components P adhering to top tape 3 fall onto the bottom of cavity 4a, therefore, when top tape 3 is peeled from carrier tape 2, components P do not flip inside cavity 4a. Thus, the orientation of component P during pickup by a suction nozzle of a component mounter on which feeder 10 is set can be maintained in a good state, and image processing of the component P can be performed with good accuracy. Also, when top tape 3 is peeled from carrier tape 2, because the component P is prevented from jumping from cavity 4a, it is possible to reliably perform component pickup with the suction nozzle.

Alternative Embodiment of Tape Curving Attachment

Figure 7A:
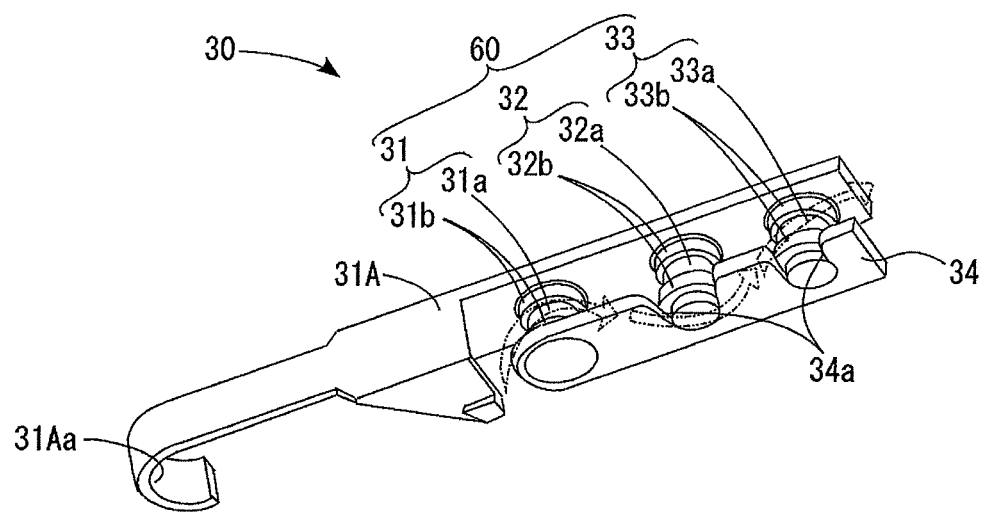
FIG. 7A is a perspective view of an alternative embodiment of a tape curving attachment.

Tape curving attachment 20 of the above embodiment is configured by being supported on first roller 121c of feeder 10 that is an auto-loading type to which two reels Ra and Rb can be attached, but tape curving attachment 30 shown in FIG. 7A is also applicable to a standard feeder to which one reel can be attached, that is, a feeder for which an operator sets component storage tape 1 on a pitch feeding mechanism section.

For tape curving attachment 30, functions of members with the same reference symbols as tape curving attachment 20 shown in FIG. 2A are the same, the configurations being different in that first roller 31 is provided. In other words, because a feeder to which tape curving attachment 30 is attached is only capable of having one reel attached, first roller 12c as provided on auto-loading type feeder 10 is not provided on reel holding section 12.

Tape curving attachment 30 is provided with tape curving section 60, frame 31A, and cover 34. Tape curving section 60 is provided with three curving sections in a similar manner to tape curving section 50 of tape curving attachment 20 shown in FIG. 2A. However, with tape curving attachment 30, the first curving section is configured from first roller 31, the second curving section is configured from second roller 32, and the third curving section is configured from third roller 33. First roller 31, second roller 32, and third roller 33 are provided with shafts 31a, 32a, and 33a, and pairs of flanges with a bearing 31b and 31b, 32b and 32b, and 33b and 33b. Further, first, second, and third rollers 31, 32, and 32 are respectively provided at the front end (right end in FIG. 7A) of frame 31A on a side surface in a rotatable manner, first, second, and third rollers 31, 32, and 32 respectively having shafts 31a, 32a, and 33a that are perpendicular with respect to the side surface.

Figure 7B:
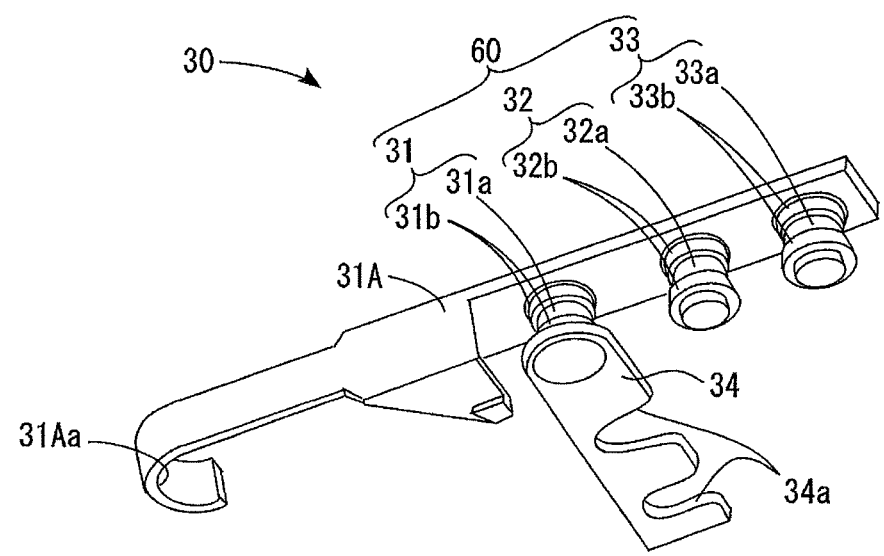
FIG. 7B is a perspective view of the tape curving attachment of FIG. 7A with the cover open.

Also, cutout 34a capable of engaging with the other end of shaft 23a or 33a of second roller 32 or third roller 33 is provided on the front end (right end in FIG. 7A) of cover 34. As shown in FIG. 7B, cover 34 is openable between first roller 31, second roller 32, and third roller 33. Tape curving attachment 30 is used by catch 31Aa of frame 31A being caught on an existing pin, or a pin newly provided on the frame of the feeder.

With tape curving attachment 30 too, similar to tape curving attachment 20 shown in FIG. 2A, component storage tape pulled from a reel, as being fed towards the feeder main body, is curved while passing over first roller 31, is curved while passing under second roller 32, and is curved again while passing over third roller 33. In other words, as shown by the two-dotted broken line arrows of FIG. 7A, first roller 31, second roller 32, and third roller 33 curve component storage tape 1 being pulled from the reel up and down as component storage tape is conveyed, so as to reduce the adhering of components P to top tape 3.

Other Embodiments

In an embodiment above, tape curving sections 50 and 60 are configured from first roller 12 (31), second roller 22 (32), and third roller 23 (33), but tape curving sections may be configured by curving the feeding path of component storage tape 1, for example, tape feeding guide 15, into a wave shape. Accordingly, component storage tape 1 can be curved by passing through tape feeding guide 15.

Also, descriptions are given of tape curving attachments 20 and 30 provided with three rollers 12c, 22, and 23, or 31, 32, and 33, but so long as there are three rollers, the tape curving attachment may be provided with four or greater rollers. Also, the diameter and arrangement interval of rollers 12c, 22, and 23, or 31, 32, and 33, influence the radius of curvature when component storage tape 1 is curved, but may be set to any diameter and arrangement interval so long as the adhering of component P to top tape 3 is reduced.

Effects

Tape curving attachments 20 and 30 of the above embodiments, are provided with tape curving sections 50 and 60 configured to curve component storage tape 1 wound around reel Rb, the component storage tape 1 being carrier tape 2 with cavities 4a in which components P are stored and top tape 3 attached to an upper surface of carrier tape 2, such that the top tape 3 side of the component storage tape 1 has a smaller radius of curvature than the carrier tape 2 side of the component storage tape 1 (r3<r2), tape curving attachment 20 or 30 being attached to feeder 10 that pitch feeds component storage tape 1 from the reel Rb. With tape curving sections 50 and 60, because the locations at which components P adhere to top tape 3 are stretched, the adhering of components P to top tape 3 is curtailed, and component P falls to the bottom of cavity 4a.

Also, because tape curving sections 50 and 60 curve component storage tape 1 such that components P adhering to top tape 3 fall onto the bottom of cavities 4a, components P are reliably separated from top tape 3. Further, tape curving sections 50 and 60 are provided with rollers 12c, 22, and 23, or 31, 32, and 33, that are rotatable in the feeding direction of component storage tape 1, and component storage tape 1 is curved by being fed through rollers 12c, 22, and 23, or 31, 32, and 33, therefore component storage tape 1 is easily curved.

Also, because tape curving attachments 20 and 30 are provided with frames 21 and 31A, frames 21 and 31 are provided with catches 21a and 31a on a rear end of frame 21 and 31, the catches being configured to catch on reel holding section 12 of feeder 10, and tape curving sections 50 and 60 are provided with three rollers, 12c, 22, and 23, or 31, 32, and 33, the rollers being supported on frame 21 and 31, the component storage tape 1 can be curved simply by pulling component storage tape 1.

Further, because tape curving attachments 20 and 30 are provided with covers 24 and 34 for preventing component storage tape 1 coming off rollers 12c, 22, and 23, or 31, 32, and 33, in an axial direction of roller shafts 21c, 22a, and 23a, or 31a, 32a, and 33a, and covers 24 and 34 are provided to open to reveal a side surface of rollers 12c, 22, and 23, or 31, 32, and 33, component storage tape 1 can be easily set on rollers 12c, 22, and 23, or 31, 32, and 33, from the revealed side. Also, because tape curving sections 50 and 60 are provided on tape feeding guide 15 (feeding path) of component storage tape 1, and component storage tape 1 is curved by passing through tape feeding guide 15, component storage tape 1 is reliably curved.

Tape curving attachments 20 and 30 can be attached to feeder 10 of the embodiments, and feeder 10 pitch feeds component storage tape 1 wound on reel Rb by pulling component storage tape 1 from reel Rb. Because components P adhering to top tape 3 fall onto the bottom of cavities 4a, when top tape 3 is peeled from carrier tape 2, components P do not flip inside cavity 4a. Thus, the orientation of component P during pickup by a suction nozzle of a component mounter on which feeder 10 is set can be maintained in a good state, and image processing of the component P can be performed with good accuracy. Also, when top tape 3 is peeled from carrier tape 2, components P do not come out of cavities 4a. Thus, it is possible to reliably perform component pickup with a suction nozzle. The disclosure is not limited to the configuration described in the embodiments described above, and various embodiments may be adopted within a scope that does not depart from the gist of the present disclosure described in the claims.

REFERENCE SIGNS LIST

1: component storage tape; 2: carrier tape; 3: top tape; 4a: cavity; 10: feeder; 11: feeder main body; 12: reel holding section; 12c, 31: first roller; 15: tape feeding guide (feeding path); 20, 30: tape curving attachment; 21, 31A: frame; 21a, 31Aa: catch; 22, 32: second roller; 23, 33: third roller; 24, 34: cover; 50, 60: tape curving section; Ra, Rb: reel; P: component; r2: radius of curvature of carrier tape 2; r3: radius of curvature of top tape 3

The invention claimed is:

1. A tape curving attachment comprising:
a tape curving section configured to curve component storage tape wound around a reel, the component storage tape being carrier tape with cavities in which components are stored and top tape attached to an upper surface of the carrier tape, such that the top tape side of the component storage tape has a smaller radius of curvature than the carrier tape side of the component storage tape, the tape curving attachment configured to be attached to a feeder that pitch feeds the component storage tape from the reel; and
a frame including a catch on a rear end of the frame, the catch configured to catch on a reel holding section of the feeder, and
the tape curving section is provided with three rollers, the three rollers supported on the frame and the component storage tape being fed on an upper side, a lower side, and an upper side of the three rollers respectively.

2. The tape curving attachment according to claim 1, wherein
the tape curving section curves the component storage tape such that the components adhering to the top tape fall to a bottom of the cavity.

3. The tape curving attachment according to claim 1, wherein
the component storage tape is curved while engaged with at least one of the three rollers.

4. The tape curving attachment according to claim 3, further comprising
a cover configured to prevent the component storage tape from coming off at least one of the three rollers in a roller axis direction, the cover configured to open to reveal a side surface of the at least one of the three rollers.

5. The tape curving attachment according to claim 1, wherein
the tape curving section is provided on a feeding path of the component storage tape, and the component storage tape is curved by being fed along the feeding path.

6. A feeder, comprising:
a tape curving attachment including
a tape curving section configured to curve component storage tape wound around a reel, the component storage tape being carrier tape with cavities in which components are stored and top tape attached to an upper surface of the carrier tape, such that the top tape side of the component storage tape has a smaller radius of curvature than the carrier tape side of the component storage tape, the tape curving attachment configured to be attached to a feeder that pitch feeds the component storage tape from the reel; and
a frame including a catch on a rear end of the frame, the catch configured to catch on a reel holding section of the feeder, wherein
the tape curving section is provided with three rollers, the three rollers supported on the frame and the component storage tape being fed on an upper side, a lower side, and an upper side of the three rollers respectively, and
the feeder is configured to pitch feed the component storage tape from the reel.

* * * * *